United States Patent [19]
Saeki et al.

[11] Patent Number: 5,557,215
[45] Date of Patent: Sep. 17, 1996

[54] SELF-BIAS MEASURING METHOD, APPARATUS THEREOF AND ELECTROSTATIC CHUCKING APPARATUS

[75] Inventors: Hiroaki Saeki, Yamanashi-ken; Masaki Kondo, Kofu, both of Japan

[73] Assignee: Tokyo Electron Limited, Japan

[21] Appl. No.: 239,982

[22] Filed: May 9, 1994

[30] Foreign Application Priority Data

May 12, 1993 [JP] Japan .................................. 5-133856
May 17, 1993 [JP] Japan .................................. 5-139153

[51] Int. Cl.⁶ .................................................. G01R 31/26
[52] U.S. Cl. ............................................................ 324/765
[58] Field of Search ........................ 204/298.31, 298.32, 204/298.34, 192.13; 156/643, 345; 216/59; 324/765

[56] References Cited

U.S. PATENT DOCUMENTS 4,968,374  11/1990  Tsukada ............................ 156/643
5,167,748  12/1992  Hall ................................. 204/298.32

*Primary Examiner*—Kenneth A. Wieder
*Assistant Examiner*—Russell M. Kobert
*Attorney, Agent, or Firm*—Graham & James

[57] ABSTRACT

According to the present invention, there are provided a self-bias measurement method of measuring the self-bias voltage of an object when the object is subjected to a plasma process by using a plasma generated between a pair of electrodes, the object being held, by means of electrostatic chucking means having an electrostatic chucking electrode, on one of the pair of electrodes situated in a processing chamber, the method including the steps of detecting a leak current between the object and the electrostatic chucking electrode while varying the DC voltage applied to the electrostatic chucking electrode, and calculating the self-bias voltage of the object on the basis of the leak current detected, an apparatus for measuring the self-bias, and an electrostatic chucking apparatus having means capable of measuring the self-bias.

11 Claims, 7 Drawing Sheets

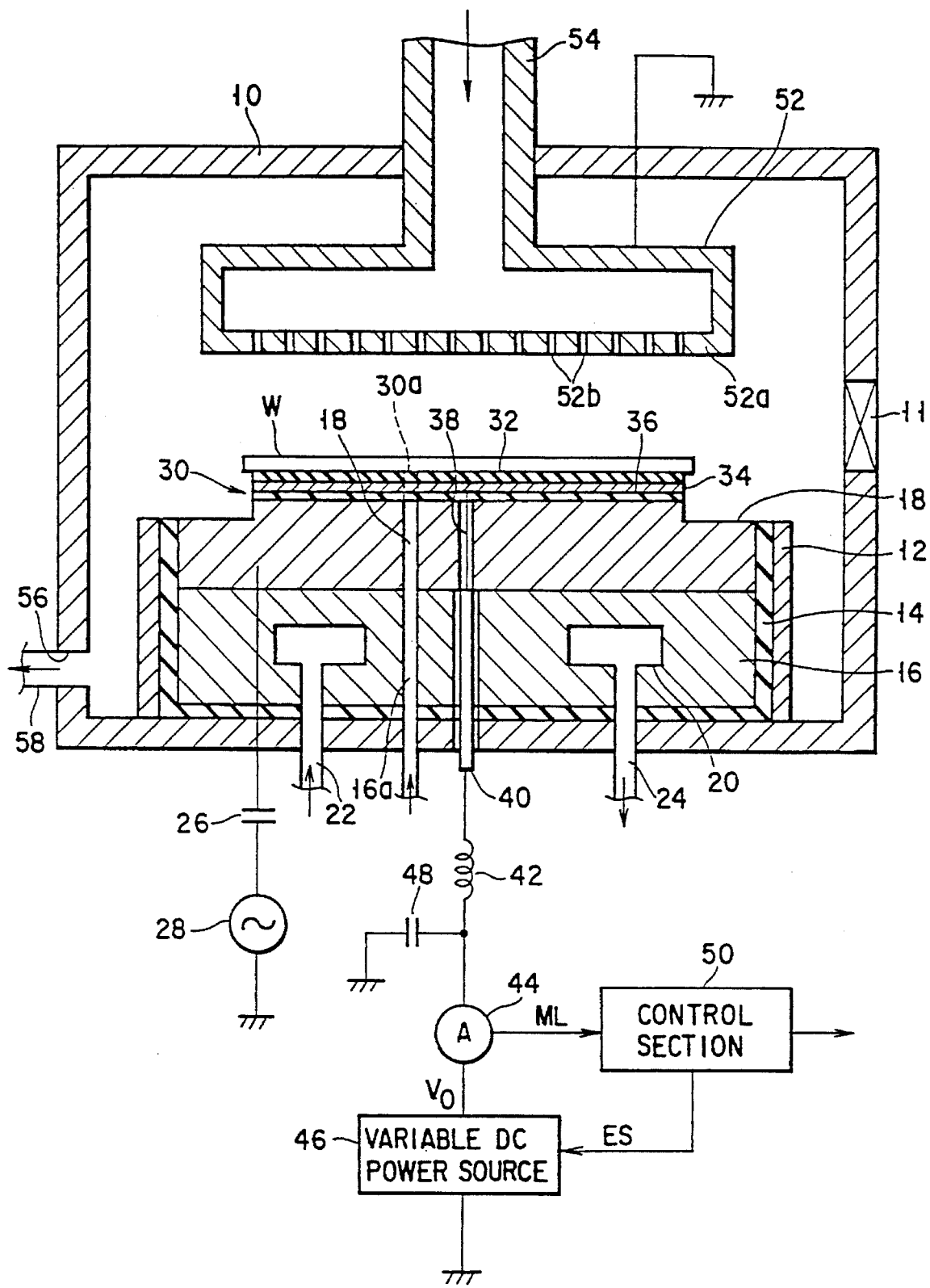
F I G. 1

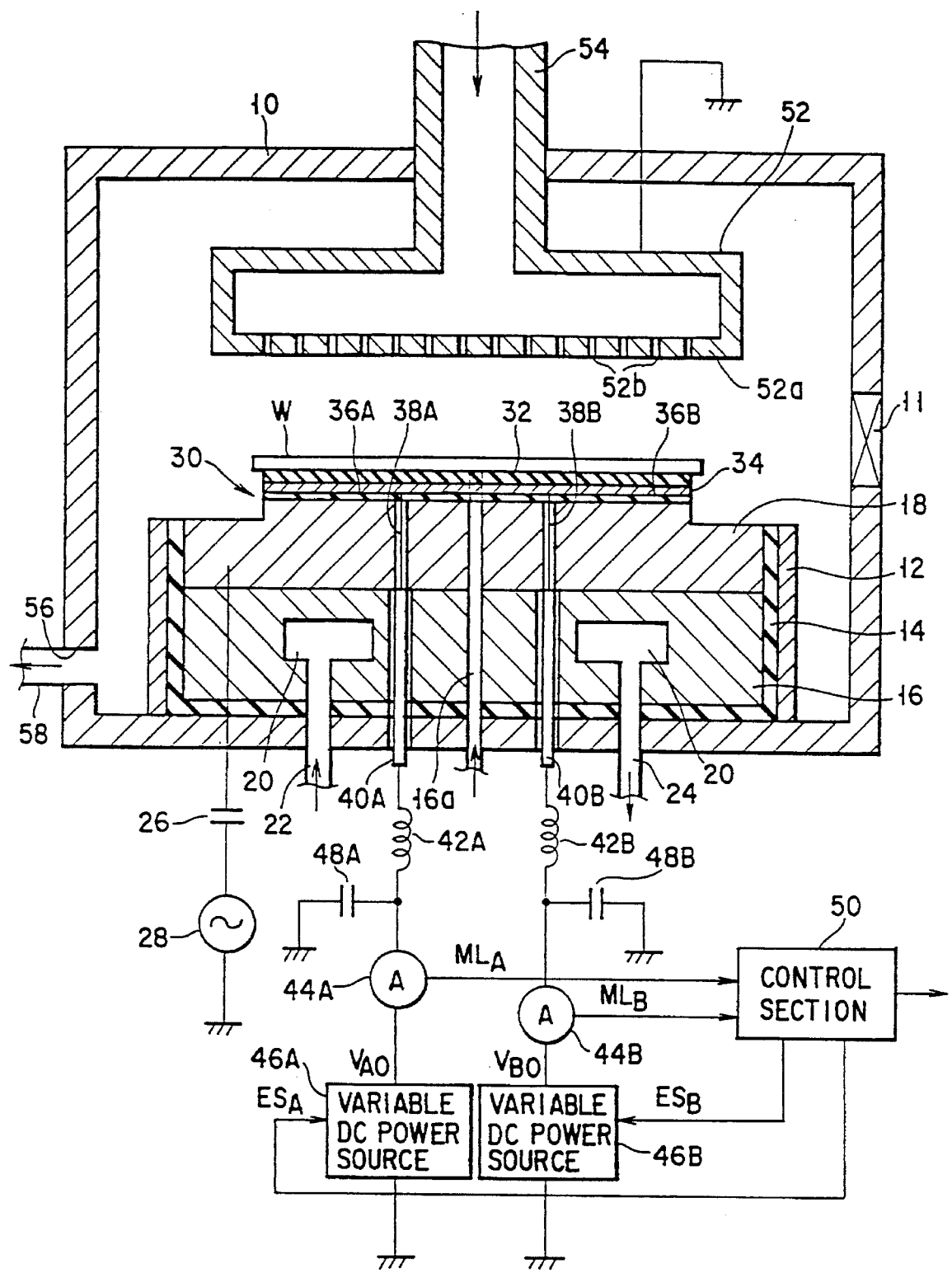
F I G. 5

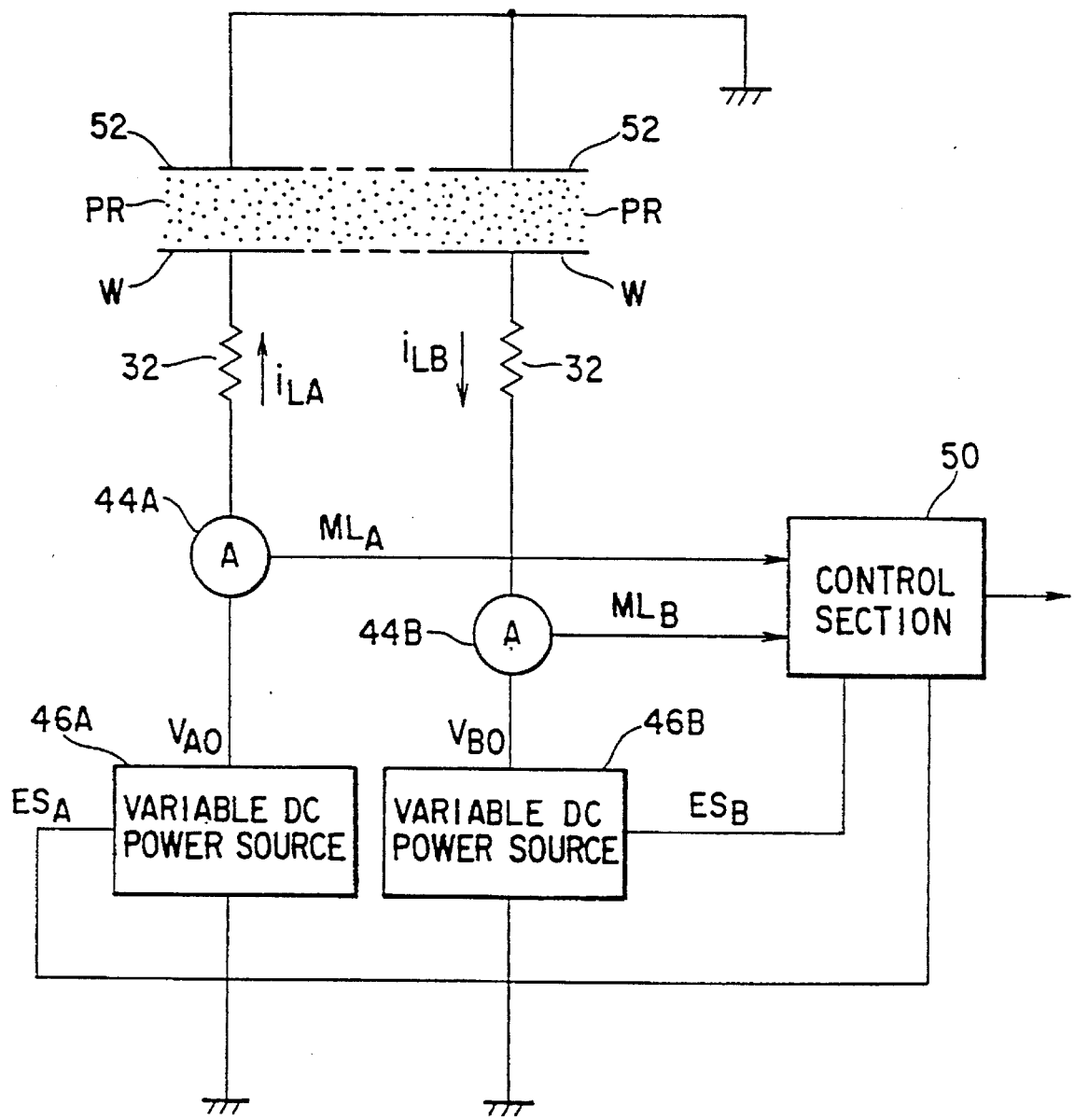
F I G. 6

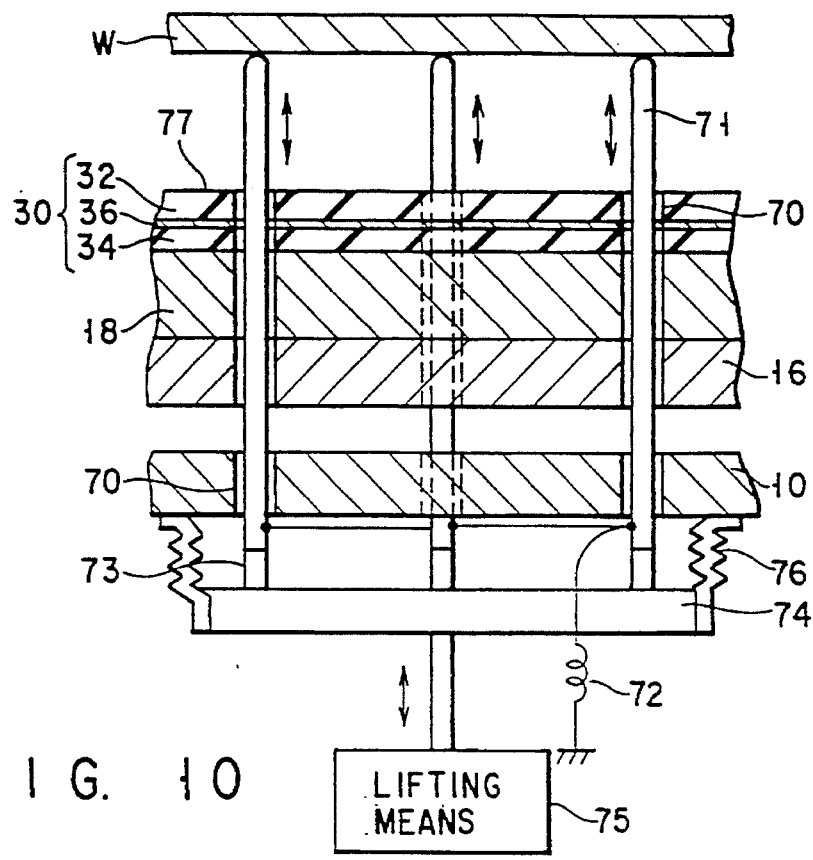
F I G. 10
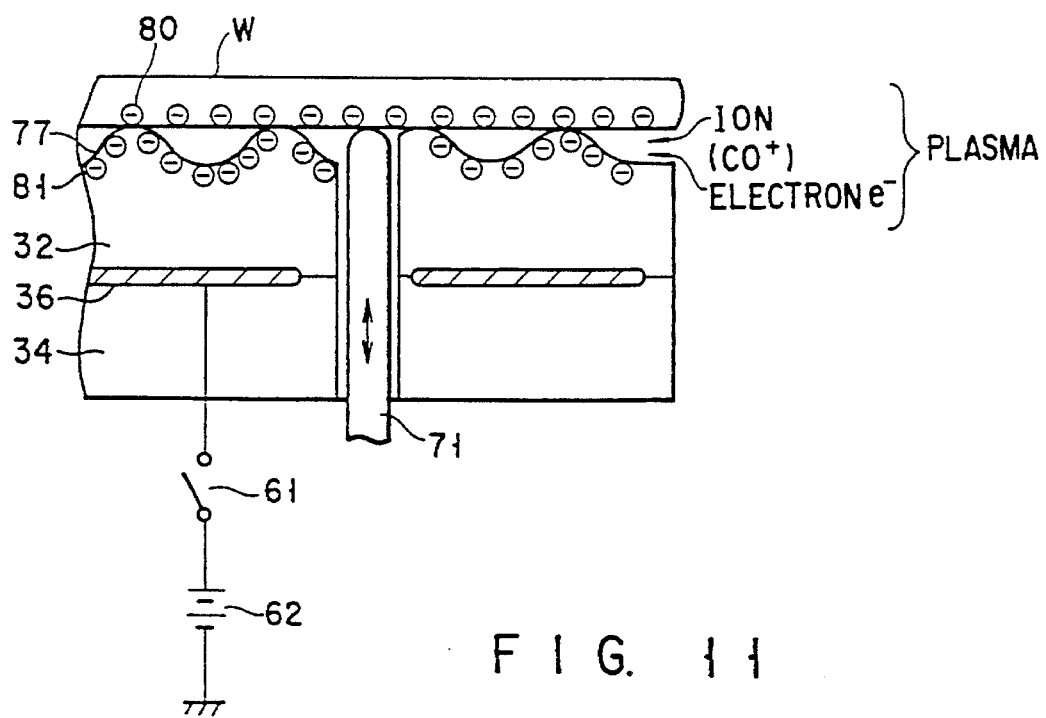
F I G. 11

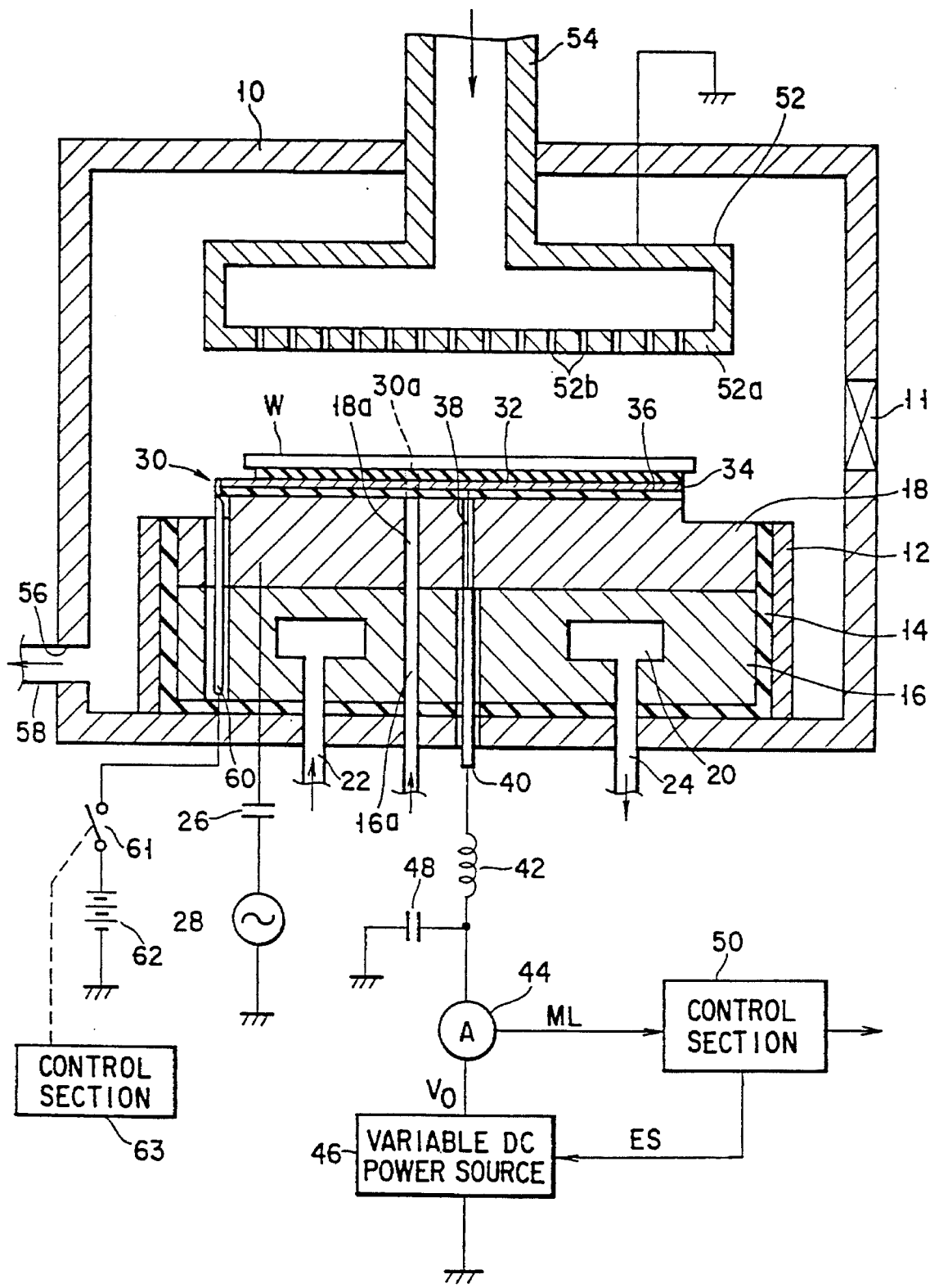
F I G. 9

SELF-BIAS MEASURING METHOD, APPARATUS THEREOF AND ELECTROSTATIC CHUCKING APPARATUS

BACKGROUND OF THE INVENTION

1. Field of the Invention

The present invention relates to a self-bias measuring method of measuring a self-bias voltage of an object to be processed in a plasma processing apparatus, an apparatus thereof, and an electrostatic chucking apparatus for holding the object on a stage by means of an electrostatic chucking force.

2. Description of the Related Art

In production of semiconductor integrated circuits, plasma is used to promote ionization of a process gas, a chemical reaction, and the like, in the process such as ashing, etching, CVD, or sputtering. In a general plasma processing apparatus, a pair of electrodes are provided in a vacuum process chamber at its top and bottom so that they face to each other. In this plasma processing apparatus, the electrode at the top side (upper electrode) is connected to the grounded potential, and a high-frequency voltage is applied to the electrode at the bottom side (lower electrode), which also serves as a stage. Thus, plasma is generated by discharge between both electrodes, and electrons, ions and the like in the plasma are attracted onto an object, for example, a semiconductor wafer, on the stage by the force of the electric field, thus performing a certain plasma process on the surface of the semiconductor.

In the above-described plasma processing apparatus, a high-frequency voltage is applied to the lower electrode via a capacitor, and therefore the object on the stage, that is, the lower electrode, generates a substantially DC negative potential, which is a so-called self-bias voltage. More specifically, during a half period where the high-frequency voltage is positive, electrons (negatively charged) in the plasma are attracted to the object side, whereas during the other half period where the high-frequency voltage is negative, ions (positively charged) in the plasma are attracted to the object side. Since the electron has a smaller weight than that of the ion, the electron is more easily movable than the ion. Consequently, more electrons are attracted than the ions, and therefore the capacitor is regularly charged. Thus, the object generates substantially a DC-based constant negative potential (self-bias voltage).

The self-bias voltage has an influence on the energy of ion made incident on the object.

When the self-bias voltage is excessively large as 400 V to 500 V, drawbacks including damages to the oxide film on the surface of the object are likely to occur. Therefore, in the plasma processing apparatus, it is necessary to measure the self-bias voltage so as to be able to adjust it to a desirable value with which the object is not adversely affected. However, in practice, it is impossible to bring the probe or the like into direct contact with an object in the processing chamber, in order to directly measure the self-bias voltage of the object. Therefore, conventionally, the self-bias voltage is estimated based on a measured value obtained by measuring the potential of the lower electrode via a voltage sense line or the like.

In the recent type of the plasma processing apparatus, a mechanical holder such as a clamp is not used, but in stead, there is provided an electrostatic chuck for holding an object on the stage by means of electrostatic chucking force. The original type of the electrostatic chuck mentioned above has the mechanism in which the surface of a base made of, for example, aluminum, is oxidized to form an insulation film, and a high DC voltage is applied to the base in order to polarize the insulation film on the surface of the base. Thus, electrostatics is generated on the interface between the stage and the object, and the object is held onto the stage by means of the electrostatic attraction force (Coulomb's force). In reality, however, such an electrostatic chucking mechanism cannot achieve sufficient polarization on the insulation film on the surface of the stage, and an electrostatic chucking force sufficient for firmly holding the object cannot be obtained. For this reason, recently, there is mainly used the electrostatic chuck having the structure in which an electrostatic chucking sheet prepared by providing a conductive film (electrostatic chucking electrode) between two insulation film, is arranged on the upper surface of a stage.

As described above, according to the conventional method for measuring the self-bias of an object, the potential of the lower electrode (stage) is measured and the self-bias voltage is estimated from this measured value. However, in the plasma processing apparatus using an electrostatic chuck, an electrostatic chucking sheet or an insulation film is arranged between the lower electrode and an object, and the chucking sheet or the film serves as a resistor or a capacitor. As a result, the potential of the lower electrode and that of the object (self-bias voltage) are not approximated to each other. Consequently, the conventional self-bias measurement method inevitably involves a considerable measurement error, and an accurate self-bias voltage measurement value cannot be obtained.

Conventionally, the value of the current voltage applied to the electrostatic chucking electrode is determined regardless of the self-bias voltage. Therefore, it takes much time and labor for setting or adjusting the DC application voltage for obtaining a necessary electrostatic chucking force. Not only that, but also even after being adjusted, the self-bias voltage varies due to the variance of the processing conditions (for example, the variance of high-frequency power for plasma generation), resulting in variance of the electrostatic chucking force.

SUMMARY OF THE INVENTION

The present invention has been proposed in consideration of the above drawbacks of the conventional technique, and an object thereof is to provide a self-bias measurement method by which the self-bias voltage of an object can be measured accurately in a short period of time using a plasma processing apparatus, and an apparatus used in such a method.

Another purpose of the present invention is to provide an electrostatic chucking apparatus used in a plasma processing apparatus, which can hold an object by a desired electrostatic chucking force and maintain the electrostatic chucking force stably at the set value regardless of the variance of the self-bias voltage.

One of the above-described objects can be achieved by a self-bias measurement method of measuring the self-bias voltage of an object when the object is subjected to a plasma process by using a plasma generated between a pair of electrodes, the object being held, by means of electrostatic chucking means having an electrostatic chucking electrode, on one of the pair of electrodes situated in a processing chamber, the method comprising the steps of: detecting a leak current between the object and the electrostatic chucking electrode while varying the DC voltage applied to the electrostatic chucking electrode and calculating the self-bias voltage of the object on the basis of the leak current detected.

Another purpose of the present invention can be achieved by a self-bias measurement apparatus comprising: a pair of electrodes situated in a processing chamber; electrostatic chucking means provided on one of the pair of electrodes, and having an electrostatic chucking electrode for chucking an object on the one of the electrodes by means of an electrostatic chucking force; variable direct current voltage generating means for applying a variable direct current voltage to the electrostatic chucking electrode; leak current detecting means for detecting a leak current between the object and the electrostatic chuck electrode; and self-bias voltage detecting means for obtaining a self-bias voltage of the object on the basis of current/voltage characteristics between a voltage value of the variable direct current voltage and a current value of the leak current.

Another purpose of the present invention can be achieved by an electrostatic chucking apparatus comprising: a pair of electrodes situated in a processing chamber; electrostatic chucking means provided on one of the pair of electrodes, and having an electrostatic chucking electrode for chucking an object on the one of the electrodes by means of an electrostatic chucking force; variable direct current voltage generating means for applying a variable direct current voltage to the electrostatic chucking electrode; leak current detecting means for detecting a leak current between the object and the electrostatic chucking electrode; self-bias voltage detecting means for obtaining a self-bias voltage of the object on the basis of current/voltage characteristics between a voltage value of the variable direct current voltage and a current value of the leak current; and voltage controlling means for controlling the variable direct current voltage applied to the electrostatic chucking electrode on the basis of the self-bias voltage so that an electrostatic chucking force sufficient for chucking the object on the one of the electrodes.

According to the self-bias measurement method and the apparatus therefor, a variable direct current voltage output from the variable direct current voltage generation means is applied to the electrostatic chucking electrode, and the leak current between the object and the electrostatic chucking electrode is detected while varying the variable direct current voltage. Based on the voltage/current characteristics between the variable direct current voltage and the leak current, a self-bias voltage value is obtained. In general, the voltage/current characteristics are expressed as a curve symmetrical with respect to the value of the self-bias voltage. In connection with this, according to the first embodiment of the self-bias measurement method, the value of the variable direct current voltage obtained when the leak current is substantially zero is regarded to be the measurement value of the self-bias voltage. According to the second embodiment of the self-bias measurement method, the intermediate value between the first and second voltage values of the variable direct current voltage obtained when the first and second leak current values having polarities opposite to each other, but the same absolute value are respectively obtained, is regarded to be the measurement value of the self-bias voltage. According to the third embodiment of the self-bias measurement method, the first and second electrostatic chucking electrodes having substantially the same electrostatic chucking characteristics with respect to an object are provided on the stage, and the intermediate value between the first and second direct current voltages obtained when leak currents (first and second leak currents) having different polarities are rendered substantially equivalent in absolute value, is regarded to be the measurement value of the self-bias voltage.

According to the electrostatic chucking apparatus of the present invention, a predetermined variable direct current is applied to the electrostatic chucking electrode on the basis of the measurement value of the self-bias voltage obtained by the self-bias measurement method of the present invention, so that the difference in voltage between an object and the electrostatic chucking electrode is rendered sufficient to have a necessary electrostatic chucking force. In this apparatus, the control and adjustment of the electrostatic chucking force are performed by the voltage control means, and therefore the variable direct current voltage is automatically adjusted and the electrostatic chucking force can be stably maintained at a set value, regardless of the variance of the self-bias voltage.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a cross section showing an overall structure of a plasma etching apparatus according to the first embodiment of the present invention;

FIG. 5 is a cross section showing an overall structure of a plasma etching apparatus according to the second embodiment of the present invention;

FIG. 6 is an electrical circuit diagram illustrating the operation of a self-bias measurement method according to the second embodiment;

FIG. 9 is a cross section showing an overall structure of a plasma etching apparatus according to the third embodiment of the present invention;

FIG. 10 is a cross section of a part of the structure, briefly illustrating the operation of separating the object shown in FIG. 9 from the electrostatic chuck; and FIG. 11 is a cross section of part of the object and chuck shown in FIG. 9, illustrating the operation of neutralizing the charges remaining on the object and the chuck.

DETAILED DESCRIPTION OF THE PREFERRED EMBODIMENTS

Figure 2:
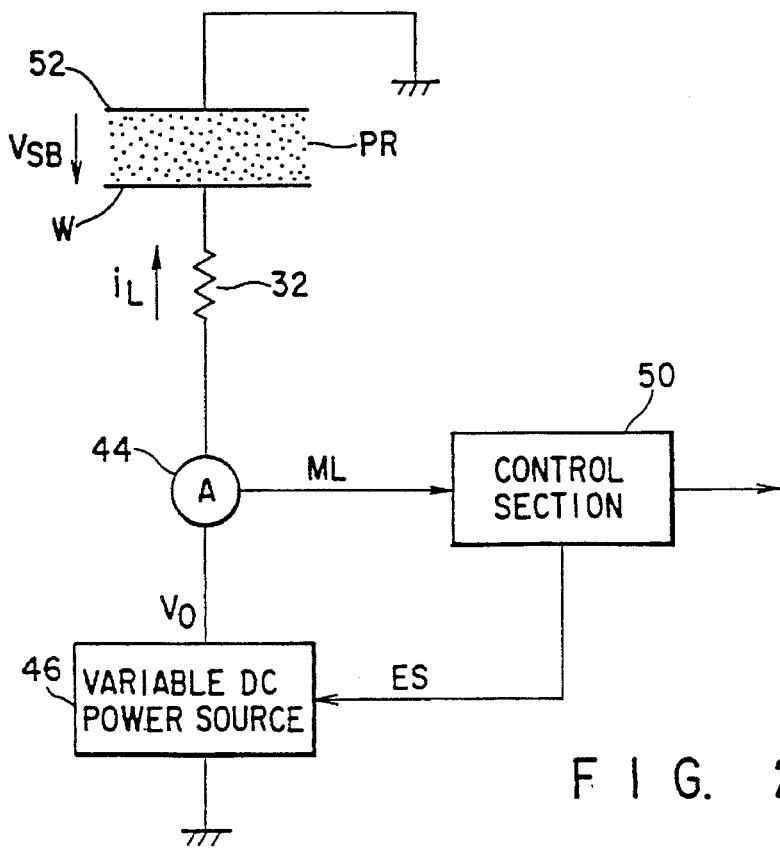
FIG. 2 is an electrical circuit diagram illustrating the operation of a self-bias measurement method according to the first embodiment.
Figure 3:
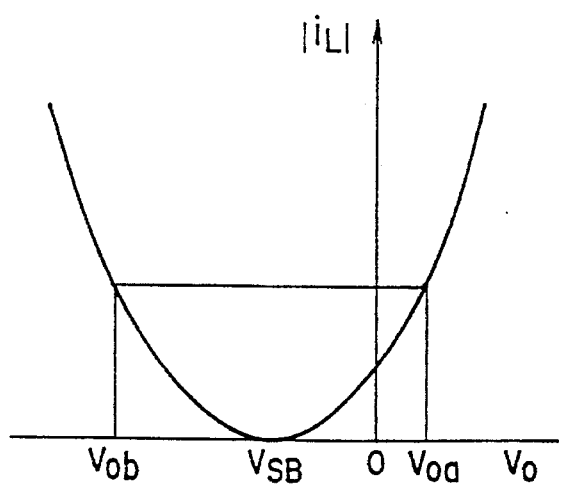
FIG. 3 is a diagram showing the voltage/current characteristics between a variable direct current voltage and a leak current, used in the self-bias measurement method according to the first embodiment.

Embodiments of the present invention will now be described in detail with reference to drawings.

FIRST EMBODIMENT

The first embodiment of the present invention will be described with reference to FIGS. 1 to 4. FIG. 1 is a cross section showing a structure of a plasma etching apparatus according to the first embodiment of the present invention. A processing chamber 10 of the plasma etching apparatus is a cylindrical chamber made of, for example, with both ends closed. In a side wall of the processing chamber 10, there is provided a gate valve 11 for loading/unloading an object such as a semiconductor wafer W into/from the processing chamber 10. The chamber is opened/closed by the gate valve 11, and an object is passed on between the chamber and a load lock chamber (not shown) disposed adjacent to the chamber 10, by means of a load/unload arm (not shown).

At least the inner wall surface of the processing chamber 10 is made of a conductive metal such as aluminum, and the surface is anodized. Further, heating means (not shown) such as heater is embedded in the wall surface of the processing chamber 10 so as to prevent reaction products resulted by processing gas or plasma from attaching to the surface, and the heating means serves to control the heating temperate within a range of, for example, 50° C. to 100° C.

On the bottom surface of the processing chamber 10, a cylindrical outer supporting frame 12 made of a conductive material is provided such as to stand, and a cylindrical inner supporting frame 14 having a bottom surface is fit into the outer supporting frame 12. A columnar supporting base 16 is provided in the inner bottom portion of the inner supporting frame 14, and a disk-like stage 18 is fixed on the supporting base 16 by means of bolts (not shown). The supporting base 16 and the stage 18 are made of a conductive metal such as aluminum. A cooling jacket 20 is provided in the supporting base 16, and cooling liquid supplied to the cooling jacket 20 via an introduction tube 22 is discarded to outside via an exhaustion tube 24. The temperature of the object can be set to, for example, −30° C. to −150° C. The supporting base 16 and the stage 18 have through-holes 16a and 18a for supplying, for example, helium gas to the rear surface of the semiconductor wafer W on the stage 18. A high-frequency power 28 is connected via a capacitor 26 to the stage 18 functioning as a lower electrode.

A circular electrostatic chuck sheet 30 is mounted on the upper surface of the base 18, and the semiconductor wafer W is placed on the electrostatic chuck sheet 30. The electrostatic chuck sheet 30 has the structure in which a thin conductive film 36 made of, for example, electrodeposited copper foil and serving as an electrostatic chucking electrode, is provided on an insulation film 34 made of, for example, polyimide, and a thin film 32 made of, for example, SiC and serving as a dielectric substance which also has the function of resistor is further formed on the thin conductive film. The electrostatic chuck sheet 30 has a through-hole 30a for supplying helium gas used for heat exchange on the rear surface of the semiconductor wafer W on the stage 18. It should be noted that the electrostatic chuck sheet 30 may have the structure in which an electrodeposited copper foil is interposed between two polyimide films.

The conductive film 36 of the electrostatic chuck sheet 30 electrically connected to a conductive wire 38 put through the stage 18 and having an insulation coating, and the conductive wire 38 is further electrically connected to the supporting base 16, the inner supporting frame 14 and a feeder rod 40 put through the outer supporting frame 12. The feeder rod 40 is connected to an output terminal of the variable direct current power source 46 via a coil 42 and an ammeter 44 situated outside the processing chamber 10.

The coil 42, in cooperation with a capacitor 48, constitutes a high-pass filter for removing high-frequency noise which entered or mixed to the direct current circuit. The ammeter 44 serves to detect current flowing in this direct current circuit, that is, a leak current between the semiconductor wafer w (object) and the conductive film 36 (electrostatic chucking electrode) of the electrostatic chuck sheet 30, and output a leak current detection signal ML which indicates its current detection value, to a control section 50. The variable direct current power source 46 is designed to be able to output an arbitrary direct current voltage V0 determined in accordance with a voltage control signal ES output from the control section 50. The control section 50 is, for example, a microcomputer, and as will be explained later, serves to control the self-bias voltage measurement and control/adjust the electrostatic chucking force in this embodiment.

A gas introduction chamber 52 is situated above the stage 18. Gas introduced into the gas introduction chamber 52 via a gas supply tube 54, for example, processing gas such as $CHF_3$, $CF_4$ or CO, or inert gas such as $N_2$, is supplied towards the semiconductor wafer w from a great number of air holes 52b of a porous plate 52a situated to face the stage 18. The gas introduction chamber 52 serves also as the upper electrode, and is grounded. An exhaustion outlet 56 is formed in the side wall of the processing chamber 10 near the bottom surface portion, and a vacuum pump (not shown) such as a turbo-molecular pump is connected to the exhaustion outlet 56 via an exhaustion tube 58.

The plasma etching process in the plasma etching apparatus having the above-described structure is carried out in the following manner. That is, 15 kW-high-frequency powers of, for example, 13.56 MHz, 40 MHz and 380 kHz are applied from the high-frequency power source 28 to the lower electrode (stage) 18 via the capacitor 26, and the processing chamber 10 is evacuated by the vacuum pump to a predetermined vacuum degree via the exhaustion outlet 54 and the exhaustion tube 56. Under this circumstance, the processing gas is supplied into the processing chamber 10 via the gas supply tube 54 and the gas introduction chamber 52. Thus, immediately underneath the gas introduction chamber 52, gas molecules of the processing gas are dissociated by the energy of the high-frequency power, generating plasma. Electrons, ions, activated species, etc. in the plasma are made incident substantially vertically on the surface (to-be-processed) of the semiconductor wafer W on the stage 18, and chemically react with the object on the wafer surface, thereby performing the etching. The reaction products gasified by the etching are discarded from the exhaustion outlet 56.

While the etching is performed, a constant direct current voltage is applied from the variable direct current power source 46 to the conductive film 36 of the electrostatic chuck sheet 30, so as to achieve the polarization on the dielectric film 32 by the DC voltage. Consequently, the positive charge is guided onto the upper surface of the conductive film 36, whereas the negative charge is guided to the rear surface of the semiconductor wafer W. Therefore, the semiconductor wafer W is chucked on the stage 18 by means of the Coulomb's force between the positive and negative charges.

In the meantime, a high-frequency power is applied from the high-frequency power source 28 to the stage 18 serving as the lower electrode via the capacitor 26. Since the plasma is present directly above the semiconductor wafer 26, the self-bias voltage is induced to the semiconductor wafer W. According to this embodiment, as will be explained below, the self-bias voltage is accurately measured, and based on the measured self-bias voltage, a DC voltage is applied to the conductive film 36 of the electrostatic chuck sheet 30 from the variable DC power source so that the semiconductor wafer W is held on the stage 18 by a predetermined electrostatic chucking force.

Next, the self-bias measurement method used in this embodiment will be described with reference to FIGS. 2 and 4. FIG. 2 is a circuit diagram of the section of this embodiment, which is related to the self-bias measurement method. The dielectric film 32 of the electrostatic chuck sheet 30 is made of SiC having a resistivity ($1 \times 10^8$ to $1 \times 10^{12}$ $\Omega \cdot$cm) residing at an intermediate between those of the conductor and insulator, and therefore the film can be regarded to be a resistor. As compared to the resistance of the resistor 32, which is considerably high, the total resistance of the conductors (42, 40, 38, or the like) from the variable DC power source 46 to the conductor film 36 is negligible. Further, ions and electrodes in the plasma can move between the upper electrode 52 and the semiconductor wafer W, and therefore the gap therebetween is a conductive space.

Therefore, there is formed an electric circuit as shown in FIG. 2, in which the ammeter 44, the resistor (dielectric film) 32, the semiconductor wafer w, the plasma PR and the upper electrode 52 are connected in series between the output terminal of the variable DC power source 46 and the ground. In the steady state, the voltage distribution (potential) in the plasma PR is stable at constant, and the potential of the semiconductor wafer W is clamped at a self-bias voltage $V_{SB}$ with respect to the upper electrode 52 (ground potential). Consequently, the direct current flowing in this circuit, namely, the leak current iL between the semiconductor wafer W and the conductive film (electrostatic chucking electrode) 36 is expressed in the following equation:

$$iL = (V_0 - V_{SB})/R \tag{1}$$

where $V_0$ represents the output voltage of the variable DC power source 46, R represents the resistance value of the resistor 32, and the voltage decrease in the ammeter 44 is regarded to be negligible.

In the above equation (1), the self-bias voltage $V_{SB}$ is constant, but the resistance value R of the resistor 32 is variable depending upon the voltage $V_0$, the temperature, and the state, for example, the oxidized state, of the rear surface of a semiconductor wafer W.

In this embodiment, the leak current iL is detected by the ammeter 44 while varying the value of the output voltage $V_0$ of the variable DC power source 46 under the control of the control section 50. Between $V_0$ and the absolute value of iL, i.e. |iL|, there is obtained a voltage/current characteristic shown in FIG. 3. According to the voltage/current characteristic, when $V_0$ is substantially equal to $V_{SB}$ (self-bias voltage), |iL| is substantially zero, and as the difference (absolute value) between $V_0$ and $V_{SB}$ increases, |iL| parabolically increases. When $V_0$ is larger than $V_{SB}$, iL flows from the conductive film (electrostatic chucking electrode) 36 side to the semiconductor wafer W side, whereas $V_0$ is smaller than $V_{SB}$, iL flows in the opposite direction, from the semiconductor wafer W side to the conductive film (electrostatic chucking electrode) 36 side.

According to the first mode of the self-bias measurement method in this embodiment, the value of $V_0$ obtained when |iL| is substantially zero, is regarded to be the measurement value of a self-bias voltage $V_{SB}$ on the grounds of the voltage/current characteristic that when $V_0$ and $V_{SB}$ are substantially equal to each other, |iL| is rendered substantially zero. The control section 50 judges the output voltage $V_0$ of the variable DC power source 46 obtained when the section receives the leak current detection value ML which indicates |iL| is substantially zero from the ammeter 44, to be the measurement value of the self-bias voltage $V_{SB}$. The control section 50 is also able to send the data of the measurement value of thus obtained self-bias voltage $V_{SB}$ to a display device or recording device (not shown) to be displayed or recorded.

According to the second mode of the self-bias measurement method in this embodiment, the intermediate value, $(V_{0a} + V_{0b})/2$, between the $V_0$ values, $V_{0a}$ and $V_{0b}$, corresponding to the current values $iL_a$ and $iL_b$ of leak currents iL having opposite polarities but having the same absolute value, is regarded to be the measurement value of the self-bias voltage $V_{SB}$ on the grounds of the voltage/current characteristic that |iL| parabolically increases as the difference between $V_0$ and $V_{SB}$ increases with respect to the value of the self-bias voltage $V_{SB}$ as the center point. In this case, the control section 20 fetches the measurement value of iL for each value of $V_0$ into its memory section (not shown), and calculates out measurement values $iL_a$ and $iL_b$ having opposite polarities but having the same absolute value, by comparison operation. Thus, $V_{0a}$ and $V_{0b}$ values corresponding to these measurement values are calculated out, and the measurement value of the self-bias voltage $V_{SB}$ is obtained from the voltages values $V_{0a}$ and $V_{0b}$ by operation.

In this embodiment, the control section 50 controls the output voltage $V_0$ of the variable DC power source 46 by open loop. If necessary, voltage detection means for detecting $V_0$ may be provided. In this case, the $V_0$ value can be monitored or controlled at a higher accuracy, and accordingly, the measurement value of the self-bias voltage $V_{SB}$ can be obtained at a higher accuracy.

In the first mode of the self-bias measurement method, if $V_0$ is rendered excessively close to $V_{SB}$, the voltage applied (potential difference) between the semiconductor wafer W and the conductive film (electrostatic chucking electrode) 36 is made small, thereby decreasing the electrostatic chucking force. Since the heat-exchange gas is supplied to the rear surface of the semiconductor wafer W, the semiconductor wafer W is likely to be pushed down from the stage 18 by pressure of the heat-exchange gas if the electrostatic chucking force is small. In order to practice the self-bias measurement method in the plasma etching apparatus shown in FIG. 1, it is necessary to provide means for holding, for example, a dummy semiconductor wafer W with an appropriate jig. In the second mode of the self-bias measurement method, measurement values $iL_a$ and $iL_b$ having opposite polarities but the same absolute value can be calculated without making $V_0$ close to $V_{SB}$, and therefore the self-bias voltage $V_{SB}$ of the semiconductor wafer W actually subjected to the etching process can be measured.

The electrostatic chucking apparatus in this embodiment includes the electrostatic chuck sheet 30, the variable DC power source 46, the ammeter 44 and the control section 50.

The control section 50 functions as self-bias voltage detection means for obtaining the measurement value of the self-bias voltage $V_{SB}$ of a semiconductor wafer W based on the voltage/current characteristic between output voltage $V_0$ of the variable DC power source 46 and leak current iL detected by the ammeter 44. Not only that, the control section 50 also functions as voltage control means for controlling the variable DC power source 46 so that a DC voltage sufficient for chucking a semiconductor wafer W on the stage by a given electrostatic chucking force during an etching process is applied to the conductive film (electrostatic chucking electrode) 36.

Figure 4:
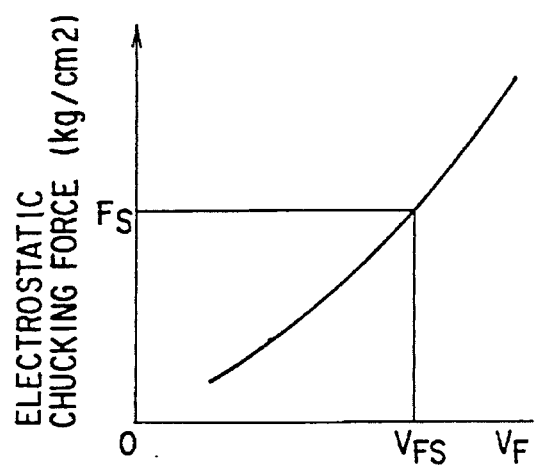
FIG. 4 is a diagram showing the characteristics between an applied voltage and an electrostatic chucking force, used in the electrostatic chucking apparatus according to the first embodiment.

More specifically, there is a relationship shown in FIG. 4 between the voltage $V_F$ applied to the conductive film (electrostatic chucking electrode) 36 and the electrostatic chucking force F, in which as the voltage $V_F$ increases, the chucking force F. This relationship is obtained as theoretical or experimental values. The control section 50, when a given electrostatic chucking force Fs is set, adds the measurement value of the self-bias voltage $V_{SB}$ to the value of $V_{FS}$ of the applied voltage $V_F$ corresponding to the Fs, and outputs the voltage $V_0$ equal to the summation value $(V_{FS}+V_{SB})$, to the variable DC power source 46.

With this embodiment, for example, even in the case where the self-bias voltage $V_{SB}$ varies due to a change in the output from the high-frequency power source 28, the control section 50 still can measure the value of the new self-bias voltage $V_{SB}$ as described above. Therefore, the electrostatic chucking force F can be stably maintained at the set value Fs by adjusting the output voltage $V_0$ of the variable DC power source 46 in accordance with the new measurement value.

SECOND EMBODIMENT

The second embodiment of the present invention will now be described with reference to FIGS. 5 to 8. FIG. 5 is a cross section showing the structure of a plasma etching apparatus according to the second embodiment. In this figure, elements common with those of the first embodiment are designated by the same reference numerals, and the explanations therefor will not be repeated. The electrostatic chucking electrode of the first embodiment consists of only one conductive film 36 in the electrostatic chuck sheet 30, whereas the chucking electrode of the second embodiment consists of two conductive films 36A and 36B arranged besides to each other and having the same area. Examples of the shape of the conductive films 36A and 36B are semicircular shown in FIG. 8A, sinking-comb-like shown in FIG. 8B and ring-like (not shown).

In this embodiment, two variable DC power source 46A and 46B are provided for the two conductive films 36A and 36B in order to supply DC currents thereto for electrostatic chuck. The output voltages $V_{A0}$ and $V_{B0}$ of the variable DC current power source 46 are supplied to the conductive films 36A and 36B via ammeters 44A and 44B, high-pass filters (42A, 48A) (42B, 48B), feeder rods 40A and 40B, and insulation-coated wires 38A and 38B. The ammeters 44A and 44B detect leak currents between a semiconductor wafer W and the conductive films 36A and 36B, respectively, and current detection signals $ML_A$ and $ML_B$ each indicating each current detection value are output to the control section 50. Each of the variable DC power sources 46A and 46B is designed such as to be able to output an arbitrary DC voltage set in accordance with voltage control signals $ES_A$ and $ES_B$, respectively, from the control section 50. The control section 50, as in the case of the first embodiment, is made of, for example, a microcomputer, and serves to control the operations of the self-bias voltage measurement and the electrostatic chuck in the second embodiment.

The self-bias voltage measurement in the second embodiment will now be described with reference to FIGS. 6 and 7. FIG. 6 is a circuit diagram illustrating a section related to the self-bias measurement in the second embodiment. As can be seen in FIG. 6, the first ammeter 44A, the resistor 32, the semiconductor wafer W, the plasma PR and the upper electrode 52 are connected in series between the output terminal of the first variable DC power source 46A and the ground, so as to form the first electric circuit. Further, the second ammeter 44B, the resistor 32, the semiconductor wafer W, the plasma PR and the upper electrode 52 are connected in series between the output terminal of the second variable DC power source 46B and the ground, so as to form the first electric circuit. Each of the first and second electric circuits has a structure similar to that of the electric circuit shown in FIG. 2. In similar to the case of the electric circuit shown in FIG. 2, leak currents iAL and iBL in the first and second electric circuits are expressed by the following equations:

$$iAL=(V_{A0}-V_{SB})/R \qquad (2)$$

$$iBL=(V_{B0}-V_{SB})/R \qquad (3)$$

Figure 7:
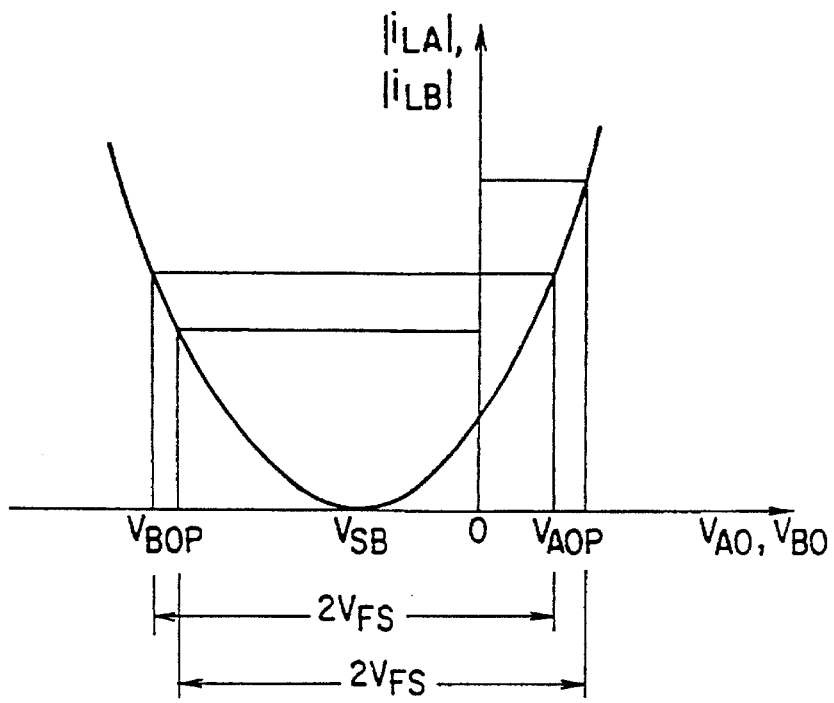
FIG. 7 is a diagram showing the voltage/current characteristics between a variable direct current voltage and a leak current, used in the self-bias measurement method according to the second embodiment.
Figure 8A:
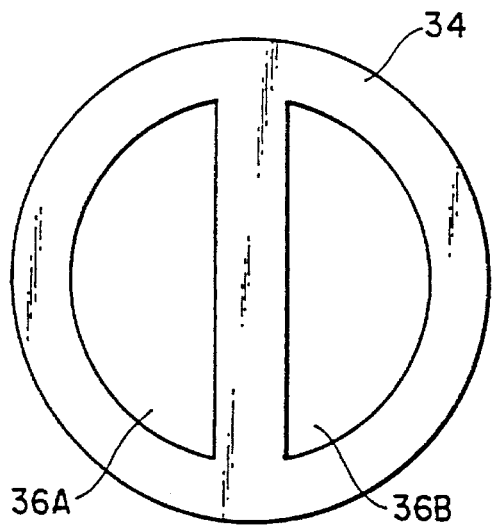
FIGS. 8A and 8B are plan views showing a structure of an electrostatic chucking electrode according to the second embodiment.
Figure 8B:
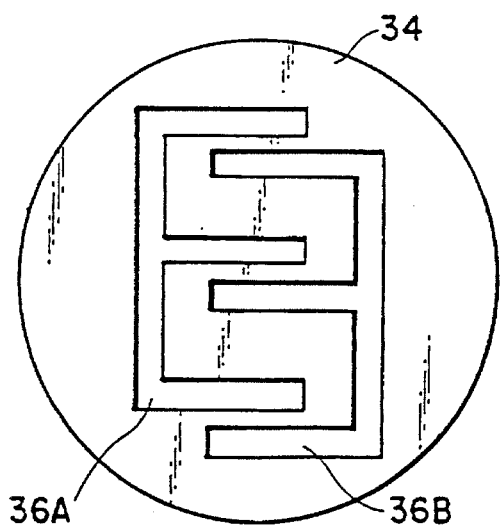

In a principle similar to that of the equation (1) of the first embodiment, between $V_{A0}$ and the absolute value of $i_{AL}$, i.e. $|i_{AL}|$ in the equation (2) and between $V_{B0}$ and the absolute value of $i_{BL}$, i.e. $|i_{BL}|$ in the equation (3), there is obtained a voltage/current characteristic shown in FIG. 7. According to the voltage/current characteristic, when $V_{A0}$ and $V_{B0}$ are substantially equal to $V_{SB}$ (self-bias voltage), $|iL|$ is substantially zero, and as the difference (absolute value) between $V_{A0}$ and $V_{SB}$, or between $V_{B0}$ and $V_{SB}$ increases, $|iL|$ exponentially increases.

In this embodiment, one of $V_{A0}$ and $V_{B0}$ (for example, $V_{A0}$) is set to a positive voltage, and the other (for example, $V_{B0}$) is set to a negative voltage. Further, while keeping the difference between both voltages $(V_{A0}-V_{B0})$ to $2V_{FS}$, which is a double of a necessary voltage $V_{FS}$ applied to the conductive films (electrostatic chucking electrodes), the $V_{A0}$ and $V_{B0}$ values are varied and thus the leak currents $i_{AL}$ and $i_{BL}$ are detected. In this case, the first leak current $i_{AL}$ flows from the first conductive film (electrostatic chucking electrode) 36A side to the wafer W side, whereas the second leak current $i_{BL}$ flows from the wafer W side to the second conductive film (electrostatic chucking electrode) 36B. Thus, the values of the $V_{A0}$ and $i_{BL}$ are adjusted such that the absolute values $|i_{AL}|$ and $|i_{BL}|$ of the first and second leak currents $i_{AL}$ and $i_{BL}$ flowing in the opposite direction to each other.

Supposing that the $V_{A0}$ and $V_{BL}$ values for equalizing $|i_{AL}|$ and $|i_{BL}|$ to each other are represented by $V_{AOP}$ and $V_{BOP}$, respectively, the $V_{SB}$ is located at the middle point between $V_{AOP}$ and $V_{BOP}$ in the voltage/current characteristic shown in FIG. 7, and therefore the measurement value of the self-bias voltage $V_{SB}$ can be set at the middle value between $V_{AOP}$ and $V_{BOP}$, that is, $(V_{AOP}-V_{BOP})/2$. As described, in this embodiment, under the control of the control section 50, the measurement value of the self-bias voltage $V_{SB}$ is obtained on the basis of the voltage/current characteristic between the variable DC voltages $V_{A0}$ and $V_{B0}$ applied to the first and second conductive films (chucking electrodes) 36A and 36B from the first and second variable DC power source 46A and 46B, and the current values (absolute values) of $|i_{AL}|$ and $|i_{BL}|$ of the first and second leak currents $i_{AL}$ and $i_{BL}$ detected by the ammeters 44A and 44B.

In this embodiment, the measurement of the self-bias voltage $V_{SB}$ can be obtained without making the output voltages of the variable DC power sources 46A and 46B close to the self-bias voltage $V_{SB}$, and therefore the self-bias voltage of the semiconductor wafer W subjected to the actual etching process, can be measured.

Further, in this embodiment, $V_{AOP}$ and $V_{BOP}$, which are $V_{AO}$ and $V_{BL}$ values obtained when $|i_{AL}|$ and $|i_{BL}|$ are equal to each other under the condition of $(V_{AOP}-V_{BOP})= 2V_{FS}$ set forth above, are calculated, and therefore $(V_{AOP}-V_{SB})=V_{FS}$ and $(V_{SB}-V_{BOP})=V_{FS}$ are established. The establishment of these equations indicates that a voltage difference $V_{FS}$ necessary for achieving a necessary electrostatic chucking force $F_s$ is applied between the semiconductor wafer W and the first conductive film (electrostatic chucking electrode) 36A and between the semiconductor wafer W and the second conductive film (electrostatic chucking electrode) 36B. In this case, the negative charge is attracted to the semiconductor wafer W side and the positive charge is attracted to the first conductive film 36A side between the semiconductor wafer W and the first conductive film (electrostatic chucking electrode) 36A, whereas the positive charge is attracted to the semiconductor wafer W side and the negative charge is attracted to the second conductive film 36B side between the semiconductor wafer W and the second conductive film (electrostatic chucking electrode) 36B.

Therefore, in this embodiment, the adjustment of the self-bias voltage measurement and that of the electrostatic chucking force can be carried out at the same time. With this operation, for example, even if the self-bias voltage $V_{SB}$ varies due to a change in the output of the high-frequency power source 28, the electrostatic chucking force F can be stable maintained at the set value $F_s$ by measuring the value of the new self-bias voltage $V_{SB}$ and adjusting the output voltages $V_{AO}$ and $V_{BO}$ of the variable DC power source 46A and 46B, at the same time. In this embodiment, the control, adjustment and operation of the self-bias voltage measurement and the electrostatic chucking force are carried out by the control section 50.

THIRD EMBODIMENT

Generally, the removal of an object, for example, a semiconductor wafer, held onto the electrostatic chuck sheet therefrom by the electrostatic force is conducted in the following manner. That is, the generation of the plasma is stopped, and a pin made of a conductive material and electrically grounded, is brought into contact with the rear surface of the semiconductor wafer to release the charge remaining on the semiconductor wafer itself, as well as the charge on the chuck sheet via the wafer.

However, with the above-described technique, the conductive pin electrically grounded is brought into contact with the rear surface of the semiconductor wafer after the generation of plasma is extinguished, and therefore the charge remaining on the wafer itself as well as on the wafer chuck portion of the chuck cannot be completely released by only once. As a result, the pin must be brought into contact with the rear surface of the wafer several times, and therefore the rear surface is likely to be damaged by the pin.

Further, if the charge remaining on the semiconductor wafer itself and the electrostatic chuck sheet is not completely released, the following problems are likely to occur. That is, due to the remaining charge, the periphery portion of the rear surface is still chucked by the sheet. More specifically, while the pins are elevated to project from the chuck sheet for the separation of a semiconductor wafer from the chuck sheet, the section of the rear surface of the semiconductor wafer which is not directly pushed by the pins, for example, the periphery portion thereof, is still chucked by the remaining charge. As a result, the wafer itself is warped. Further, when the pins are elevated higher from the sheet, the periphery section of the wafer is finally separated from the electrostatic chuck sheet. At the moment of the separation, the wafer springs up due to the reaction to the warp, and may collide with the wall or the like of the processing chamber, resulting in damage to the semiconductor wafer itself.

In the case where an insulation film, for example, an oxide film including a naturally oxidized film, is formed on the surface of the semiconductor wafer, it is not possible to entirely release the charge remaining on the surface of the insulation film. This is because the section which is not in contact with the pin is electrically shut off by the insulation film.

In this embodiment, there is provided a method of not only measuring the self-bias of an object, but also capable of separating the object chucked on the chuck sheet by electrostatic force therefrom, while maintaining the object horizontal with respect to the chuck sheet (without warping the wafer). In this method, the application of voltage to the electrostatic chuck sheet is stopped during the generation of plasma, and while the plasma is still generated, the object is separated from the chuck sheet by means of the separation means.

According to this method, since the object is separated from the chuck sheet while the plasma is generated, ions or electrons in the plasma enter between the object and chuck sheet. Consequently, in the case where the remaining charge is negative, the negative charge is neutralized by the ions, whereas in the case where the remaining charge is positive, the positive charge is neutralized by the electrons. Thus, the remaining charge on the chuck sheet or the object can be eliminated more surely and in a shorter period of time, than in the conventional technique.

FIG. 9 is a cross section showing the structure of a plasma etching apparatus according to the third embodiment of the present invention. In this figure, the elements in common with those of the first embodiment (FIG. 1) are designated by the same reference numerals and the explanations therefor will not be repeated.

To the conductive film 36 of the electrostatic chuck sheet, a feeder rod 60 is electrically connected in order to supply a voltage of 200 V to 3 kV to the conductive film 36. The feeder rod 60 is pierced through the bottom surface of the processing chamber 10 in the air-tight and insulation state, and electrically connected to the high-voltage power source 62 via switching means, for example, an electromagnetic switch 61. The electromagnetic switch 61 is turned ON or OFF by a control signal from the control section 63.

As shown in FIG. 10, a plurality of, for example, three through-holes 70 are made in the supporting base 16, the stage 18 also serving as the lower electrode, the electrostatic chuck sheet 30 and the bottom surface of the processing chamber 10, and pins 71 made of a conductive material and electrically grounded via an inductance 72 are provided in the through-holes 70. The pins 71 are fixed on the pin supporting base 74 via an insulation material such as ceramics 73. On the periphery section of the pin supporting base 74 and the bottom surface of the processing chamber 10, there is provided an expandable bellows in order to keep the air-tight condition between the processing chamber 10 and the pin supporting base 74. Further, the pin supporting base 74 is connected to a lifting means, for example, an air cylinder 75, for lifting the pin supporting base 74. With this structure, as the air cylinder 75 moves up and down, the pins 71 are moved up and down accordingly. Thus, the semiconductor wafer W is held on a chucking surface 77 of the electrostatic chuck sheet 30, or separated from the surface 77.

Next, the operation of separating a semiconductor wafer W held on the chuck sheet 30 by electrostatic force, in a plasma etching apparatus having the above structure, will be described. Since the plasma processing of a semiconductor wafer and the self-bias measurement are carried out in a similar manner to those of the first embodiment, explanations therefor will be omitted.

In order to place a semiconductor wafer on the electrostatic chuck sheet 30, the pins 71 are lowered by means of the air cylinder 75, and the semiconductor wafer is placed on the chucking surface 77 of the chuck sheet 30. In this case, the switch 61 is turned off and a high voltage is supplied to the chuck sheet 30 in advance. Therefore, as shown in FIG. 11, a negative charge 80 is created on the surface of the semiconductor wafer W, whereas a positive charge 81 is created on the chucking surface 77 of the chuck sheet 30. Thus, an electrostatic chucking force is generated by the negative and positive charges 80 and 81, and the semiconductor wafer W is chucked on the surface 77 of the chuck sheet 30 by the electrostatic chucking force.

Next, a processing gas is supplied from the gas supply tube 64 into the processing chamber 10 via the through-holes 52b, and the pressure in the chamber 10 is stabilized to a given value, for example, 10 mTorr to 10 Torr. Then, helium gas is supplied onto the entire rear surface of the semiconductor wafer W through a heat-exchange medium supply path (not shown).

After that, a high-frequency power, for example, 500 W to 2 kW, is applied to the lower electrode 18 from the high-frequency power source 28 so as to generate plasma between the upper electrode and the semiconductor wafer W. The wafer W is thus etched by the plasma. At the same time, by the generation of the plasma, the semiconductor wafer W is substantially grounded, and therefore the chucking force for chucking the wafer W on the surface 77 of the chuck sheet 30 is increased.

In order to remove the wafer W from the surface 77 of the chuck sheet 30, the power applied from the high-frequency power source 28 is decreased to a level by which the wafer W is not substantially etched, for example, 80 W or lower. Then, the supply of the helium gas, which is carried out onto the entire rear surface of the wafer W through the heat-exchange medium supply path, is stopped, and the switch 61 is opened. Thus, the application of a high voltage to the conductive film 36 of the chuck sheet 30 is stopped.

Further, as can be seen in FIG. 11, ions in plasma generated by an application power by which the etching of the semiconductor wafer W does not proceed, for example, $CO^+$ when the processing gas is CO, or electrons in the plasma enter between the semiconductor wafer W and the chucking surface 77 of the electrostatic chuck sheet 30. Consequently, the negative charge 80 remaining from the periphery of the wafer W to the surface of the semiconductor wafer W is neutralized (eliminated) by the ions towards the center of the wafer W, whereas the positive charge 81 remaining on the chucking surface 77 of the chuck sheet 30 is neutralized by the electrons towards the center of the wafer W.

While the neutralization is proceeding, the pins 71 are ascended by means of the air-cylinder 75 to lift the semiconductor wafer W so that ions or electrons in the plasma can more easily enter between the wafer W and the surface 77 of the chuck sheet 30. Therefore, the neutralization of the remaining charge on the surface of the wafer W and the chucking surface 77 of the sheet 30 is accelerated. Thus, the semiconductor wafer W is detached from the chucking surface 77 of the chuck sheet 30.

As described above, the remaining charge on the semiconductor wafer W and on the chucking surface 77 of the chuck sheet 30 is neutralized by the ions or electrons in the plasma from the periphery portion of a wafer W towards the center thereof, and the wafer W is separated from the chucking surface 77 of the sheet 30 by means of the pins 71. Since the periphery portion of the rear surface of the semiconductor wafer W is no longer chucked by remaining charge, the semiconductor wafer W is not warped even if the pins 71 are lifted from the chucking surface 77 to lift up the wafer W. Thus, the wafer can be removed from the surface 77 of the sheet 30 while keeping the horizontal state. Further, in this case, the remaining charge on the semiconductor wafer W and on the chucking surface 77 of the sheet 30 can be uniformly eliminated. Furthermore, while the plasma is generated, the remaining charge on the object is released via the plasma region to the upper electrode and the like, enabling to release much more remaining charge.

As described above, according to the self-bias measurement method of the present invention and the apparatus therefor, the leak current between an object and an electrostatic chucking electrode is detected while varying the value of the DC voltage applied to the chucking electrode, and the measurement value of the self-bias voltage is obtained on the basis of the voltage/current characteristic between the applied DC voltage and the leak current. Therefore, a highly accurate and error-free self-bias voltage measurement can be obtained in a short period of time.

Further, according to the electrostatic chucking apparatus of the present invention, a predetermined variable DC voltage is applied to the electrostatic chucking electrode on the basis of the measurement value of the self-bias voltage such that the voltage difference between an object and the electrostatic chucking electrode is sufficient to achieve a necessary electrostatic chucking force. Therefore, regardless of the variation of the self-bias voltage, the electrostatic chucking force is stably maintained at a preset value.

The present invention is not limited to the above-described embodiments, but can be modified into various versions as long as the technical idea of the invention remains. For example, the electrostatic chucking electrode may be of any type as long as it can be situated to face an object via a film or plate having both dielectric and electrically leaking properties, and the shape, structure and size may be arbitrarily selected. Therefore, a structure other than that of the electrostatic chuck sheet can be applied to the present invention.

In the second embodiment, the first and second conductive films (electrostatic chucking electrodes) 36A and 36B having the same area are disposed besides to each other within the same plane of the chuck sheet 30. But even if the first and second electrodes differs from each other in shape or size, the equal electrostatic chucking characteristic can be obtained by changing the distance (gap) between the object and each of the electrodes in accordance with the difference in shape or size.

Further, the circuit structure of the ammeter 44, 44A or 44B, or the variable DC power source 46, 46A or 46B, or the circuit structure as well as the software of the control section 50 may be arbitrarily modified or remodeled. Or, the operator may adjust the output voltage of the variable DC power source 46, 46A or 46B manually while monitoring the measurement value of the ammeter 44, 44A or 44B displayed, when the control section 50 is not provided.

In the embodiments, the present invention is used as a plasma etching apparatus, but the invention is also applicable to other plasma processing apparatus such as plasma CVD apparatus. Also, the invention is applicable to objects other than semiconductor wafer W, for example, LCD substrate.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A self-bias measurement method of measuring the self-bias voltage of an object when the object is subjected to a plasma process by using a plasma generated between a pair of electrodes, said object being held, by means of electrostatic chucking means having an electrostatic chucking electrode, on one of the pair of electrodes situated in a processing chamber, said method comprising the steps of:
detecting a leak current between the object and the electrostatic chucking electrode while varying the DC voltage applied to the electrostatic chucking electrode; and
calculating the self-bias voltage of the object on the basis of the leak current detected.

2. A method according to claim 1, wherein in the self-bias voltage calculating step, a value of the DC voltage obtained when the leak current value is substantially zero is regarded as the self-bias voltage value.

3. A method according to claim 1, wherein in the self-bias voltage calculating step, a value of substantially intermediate between the first and second voltage values obtained when the first and second current values of the leak currents having opposite polarities but the same absolute value, is regarded as the self-bias voltage value.

4. A method according to claim 1, wherein a DC voltage is applied to the electrostatic chucking electrode on the basis of the self-bias voltage value, such that a voltage difference between the object and the electrostatic chucking electrode is sufficient to obtained an electrostatic chucking force for chucking the object on the electrostatic chucking electrode.

5. A method according to claim 1, wherein there are two of the electrostatic chucking electrodes, and a DC voltage is applied to each of the chucking electrodes while varying the DC voltage so that a polarity of a leak current flowing between one of the chucking electrodes and the object differs from that of a leak current flowing between the other chucking electrode and the object, whereby to detect the two leak currents flowing between the object and each of the chucking electrodes.

6. A self-bias measurement method of measuring the self-bias voltage of an object when the object is subjected to a plasma process by using a plasma generated between a pair of electrodes, said object being held by means of electrostatic chucking means having two electrostatic chucking electrodes on one of the pair of electrodes situated in a processing chamber, said method comprising the steps of:

detecting leak currents flowing between the object and each of the two electrostatic chucking electrodes while varying a DC voltage applied to each of the two electrostatic chucking electrodes so that a polarity of a leak current flowing between one of the two chucking electrodes and the object differs from that of a leak current flowing between the other of the two chucking electrodes and the object, and calculating the self-bias voltage of the object on the basis of the leak currents detected, wherein an intermediate value between voltage values obtained when absolute values of the two leak currents are substantially equal to each other, is regarded as the self-bias voltage value.

7. A self-bias measurement apparatus comprising:

a pair of electrodes situated in a processing chamber;

electrostatic chucking means provided on one of the pair of electrodes, and having an electrostatic chucking electrode for chucking an object on the one of the electrodes by means of an electrostatic chucking force;

variable direct current voltage generating means for applying a variable direct current voltage to the electrostatic chucking electrode;

leak current detecting means for detecting a leak current between the object and the electrostatic chuck electrode; and self-bias voltage detecting means for obtaining a self-bias voltage of the object on the basis of current/voltage characteristics between a voltage value of the variable direct current voltage and a current value of the leak current.

8. An electrostatic chucking apparatus comprising:

a pair of electrodes situated in a processing chamber;

electrostatic chucking means provided on one of the pair of electrodes, and having an electrostatic chucking electrode for chucking an object on the one of the electrodes by means of an electrostatic chucking force;

variable direct current voltage generating means for applying a variable direct current voltage to the electrostatic chucking electrode;

leak current detecting means for detecting a leak current between the object and the electrostatic chucking electrode;

self-bias voltage detecting means for obtaining a self-bias voltage of the object on the basis of current/voltage characteristics between a voltage value of the variable direct current voltage and a current value of the leak current; and voltage controlling means for controlling the variable direct current voltage applied to the electrostatic chucking electrode on the basis of the self-bias voltage so that an electrostatic chucking force sufficient for chucking the object on the one of the electrodes.

9. An apparatus according to claim 8, wherein the voltage controlling means controls the variable DC voltage so that a voltage substantially equal to a sum of or difference between the self-bias voltage value and the voltage value between the object and the chucking electrode necessary to have an electrostatic chucking force sufficient to hold the object on one of the chucking electrodes, is applied to the chucking electrode when the object is processed.

10. An apparatus according to claim 8, wherein there are two of the electrostatic chucking electrodes, and variable DC voltage detection means and leak current detection means are connected to each of the chucking electrodes.

11. An electrostatic chucking apparatus comprising:

a pair of electrodes situated in a processing chamber;

electrostatic chucking means provided on one of the pair of electrodes, and having two electrostatic chucking electrodes for chucking an object on one of the electrodes by means of an electrostatic chucking force;

variable direct current voltage generating means for applying a variable direct current voltage to each of the electrostatic chucking electrodes;

variable DC voltage detection means connected to each of the chucking electrodes;

leak current detecting means connected to each of the chucking electrodes for detecting two leak currents flowing between the object and each of the electrostatic chucking electrodes;

self-bias voltage detecting means for obtaining a self-bias voltage of the object on the basis of current/voltage characteristics between a voltage value of the variable direct current voltage and a current value of the detected leak currents; and voltage controlling means for controlling the variable DC voltage applied to each of the electrostatic chucking electrodes on the basis of the self-bias voltage so that a voltage difference between the variable DC voltages is maintained at double the value of the voltage difference between the object and each of the chucking electrodes necessary to have an electrostatic chucking force sufficient to hold the object on one of the chucking electrodes, and absolute values of leak currents detected by the leak current detection means are substantially equal to each other.

* * * * *